(12) United States Patent
Mueller-Fiedler et al.

(10) Patent No.: US 6,362,083 B1
(45) Date of Patent: Mar. 26, 2002

(54) METHOD FOR FABRICATING LOCALLY REINFORCED METALLIC MICROFEATURE

(75) Inventors: Roland Mueller-Fiedler, Leonberg; Juergen Graf, Stuttgart; Stefan Kessel, München, all of (DE); Joerg Rehder, Copenhagen (DK)

(73) Assignee: Robert Bosch GmbHl, Stuttgart (DE)

( * ) Notice: Subject to any disclaimer, the term of this patent is extended or adjusted under 35 U.S.C. 154(b) by 0 days.

(21) Appl. No.: 09/449,369

(22) Filed: Nov. 24, 1999

(30) Foreign Application Priority Data

Nov. 27, 1998 (DE) .......................... 198 54 803

(51) Int. Cl.⁷ ............................... H01L 21/28
(52) U.S. Cl. .................. 438/570; 438/511; 438/597; 438/618; 438/622; 438/623; 438/625; 438/637; 438/538; 438/639; 438/640; 438/652; 438/975
(58) Field of Search ................. 438/571, 597, 438/618, 622, 623, 625, 637–640, 652, 795

(56) References Cited

U.S. PATENT DOCUMENTS 5,567,334 A * 10/1996 Baker et al. ................. 216/24
5,638,946 A * 6/1997 Zavracky .................... 200/181
6,171,945 B1 * 1/2001 Mandal et al. .............. 438/622

OTHER PUBLICATIONS

"Texas Instruments Digital Light Processing and MEMS: Timely Convergence for a Bright Future," L.J. Hornbeck, Micromachining and Microfabrication 95, Plenary Session Paper, Texas, U.S., 1995.

* cited by examiner

Primary Examiner—Olik Chaudhuri
Assistant Examiner—Wai-Sing Louie
(74) Attorney, Agent, or Firm—Kenyon & Kenyon

(57) ABSTRACT

A method for fabricating a locally reinforced metallic microfeature on a substrate provided preferably with an electrical contacting or a driving circuit, and on an organic, patterned sacrificial layer, which is removed after the metallic microfeature is applied, is described. In fabricating the local reinforcement of the microfeature, at least one further organic layer, formed as a mask, is deposited, which is likewise removed following pattern delineation of the metallic layer.

16 Claims, 13 Drawing Sheets

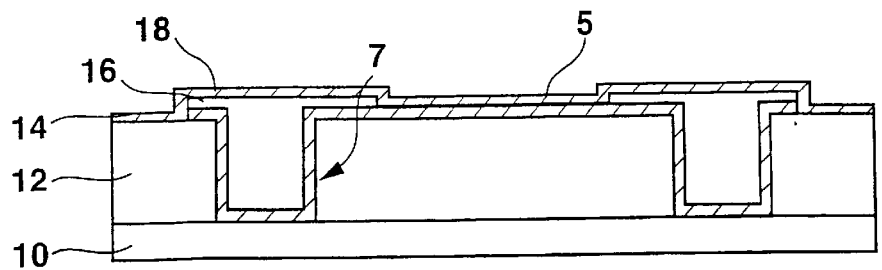
Fig. 2e
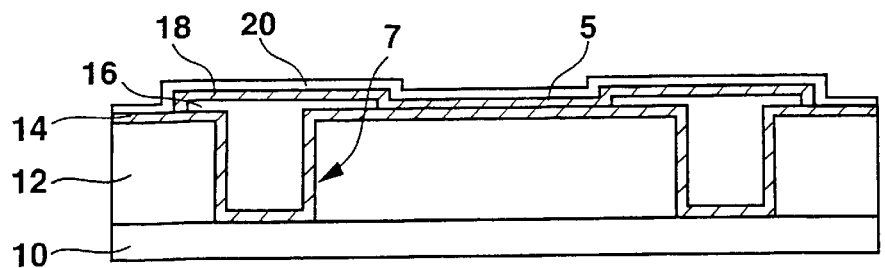
Fig. 2f
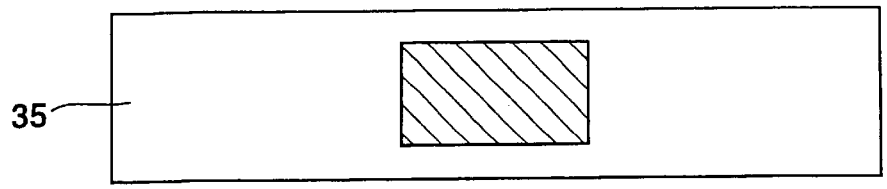
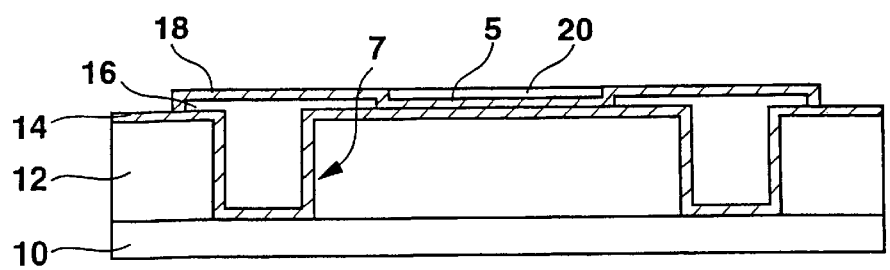
Fig. 2g
Fig. 2h
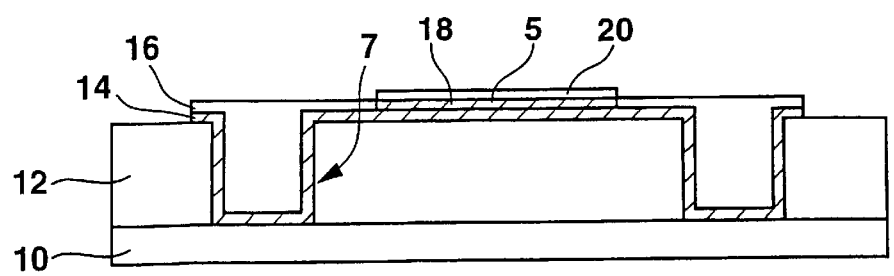
Fig. 2i

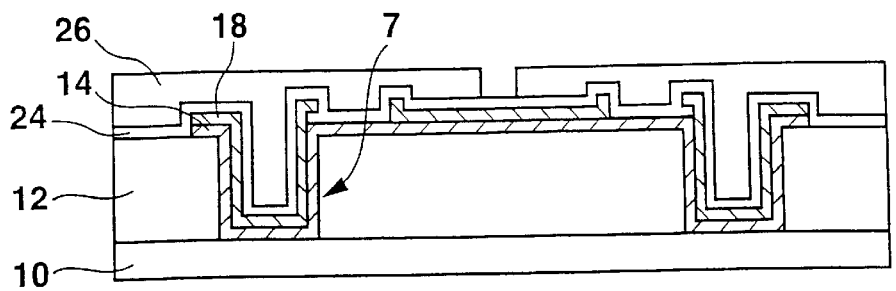
Fig. 4d
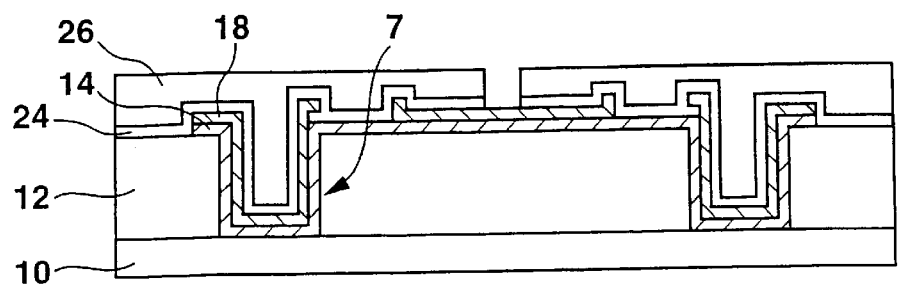
Fig. 4e
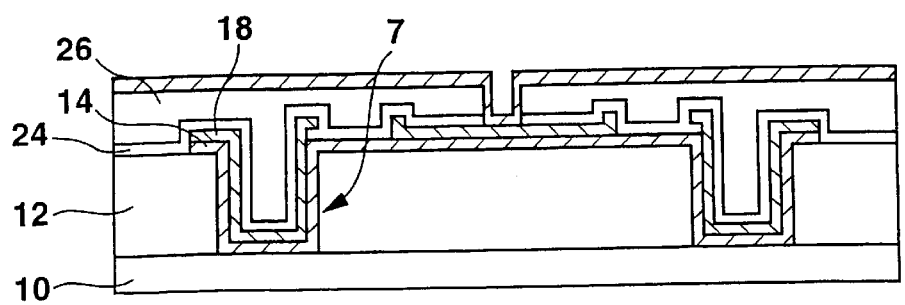
Fig. 4f
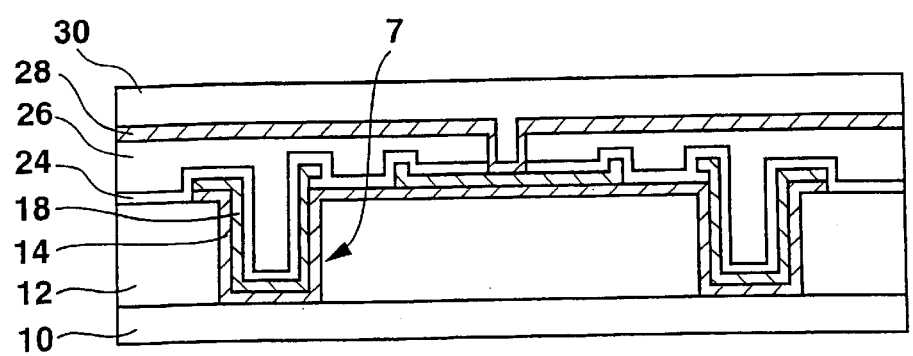
Fig. 4g
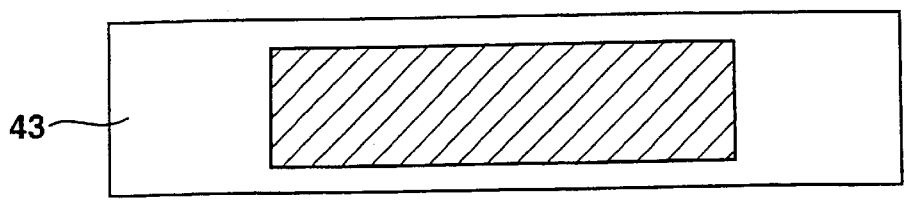

METHOD FOR FABRICATING LOCALLY REINFORCED METALLIC MICROFEATURE

FIELD OF THE INVENTION

The present invention relates to a method for fabricating a locally reinforced metallic microfeature, in particular of micro-reflectors. The microfeature, for example of a reflector plate and/or of a recess (cut-out), is locally strengthened in order to avoid deformations in the reflector plate, and to achieve the necessary stability for the recesses in order to suspend the tilting-type elements.

BACKGROUND INFORMATION

A method using an organic photo-sensitive resist layer in the micrometer range for fabricating micro-reflectors having locally thicker layers is described in the publication "Texas Instruments Digital Light Processing and MEMS: Timely Convergence for a Bright Future," L. J. Hornbeck, Micromachining and Microfabrication 95, Plenary Session Paper, Texas, U.S., 1995. This conventional method uses a complicated and cost-intensive process for masking the reflector surface with a silicon dioxide mask and subsequently subjecting the aluminum layers to a plasma etching.

SUMMARY

The photolithography employed in the method of the present invention, with subsequent wet-chemical etching of the metal layers, is less complicated and more cost-effective from a technological standpoint. To fabricate the patterned sacrificial layer and the photo-sensitive resist layers required by the method, both positive as well as negative photo-sensitive resists can be used. When working with the positive photo-sensitive resist, the exposed regions are removed following irradiation and development.

Exemplary embodiments for fabricating locally reinforced features in the form of micro-reflectors in micro-reflector arrays, where the recesses (posts and hollow posts) supporting the micro-reflectors, support two contiguous micro-reflectors, are depicted in the drawings and elucidated in the following description.

BRIEF DESCRIPTION OF THE DRAWINGS

FIGS. 2a–2i depict the steps of a method for fabricating a reinforced reflector plate, according to the present invention.

FIGS. 4a–4l show the steps of a method for constructing multi-layer, locally interconnected features, according to the present invention.

DETAILED DESCRIPTION

The exemplary methods described herein are differentiated from one another by the type and number of process steps, the materials used, as well as by the number of masks required for the photopatterning process.

Figure 1A:
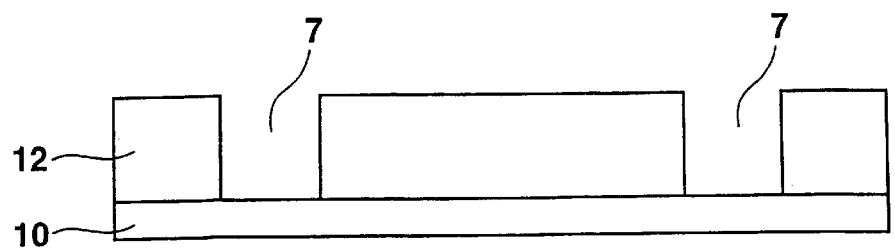
FIGS. 1a–1i show the steps of a method for reinforcing a reflector plate and two recesses used as posts, according to the present invention.
Figure 1B:
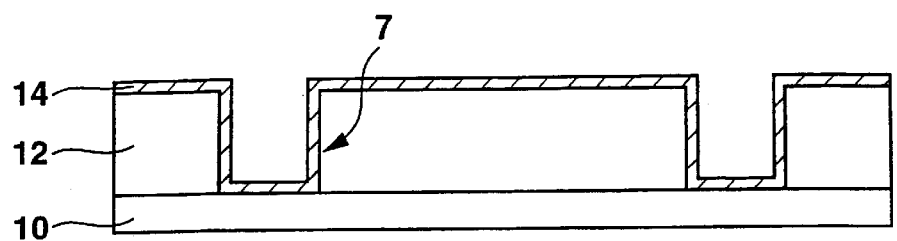
Figure 1C:
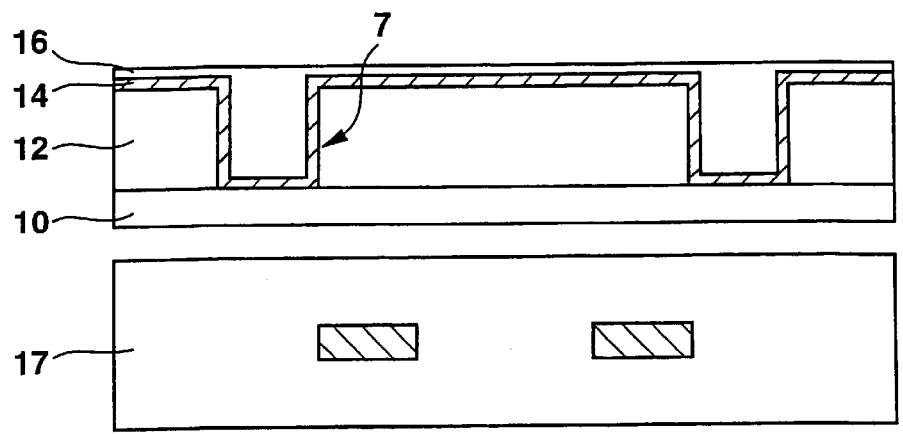
Figure 1D:
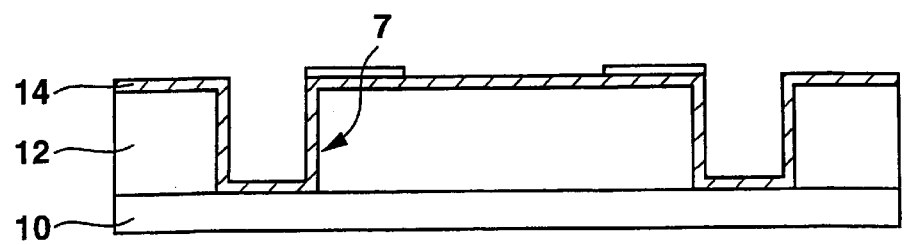
Figure 1E:
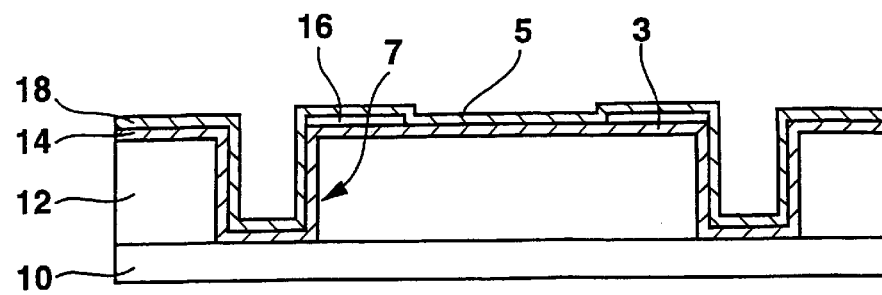
Figure 1F:
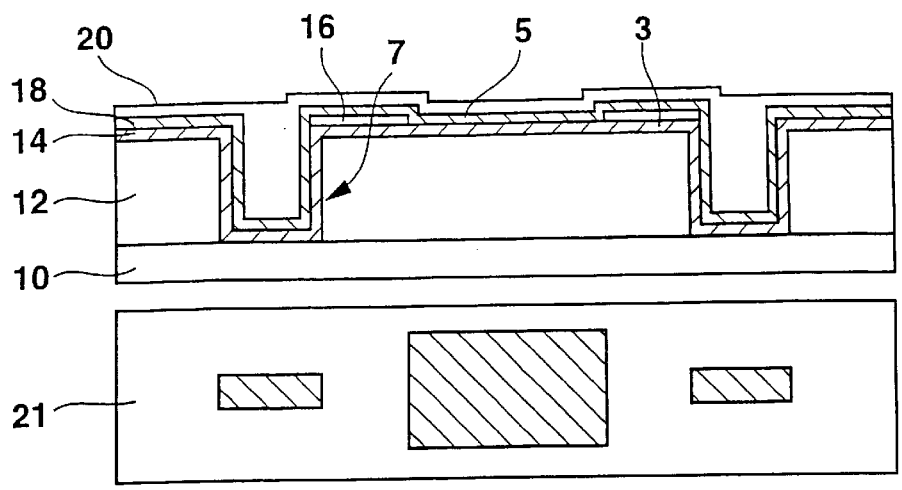
Figure 1G:
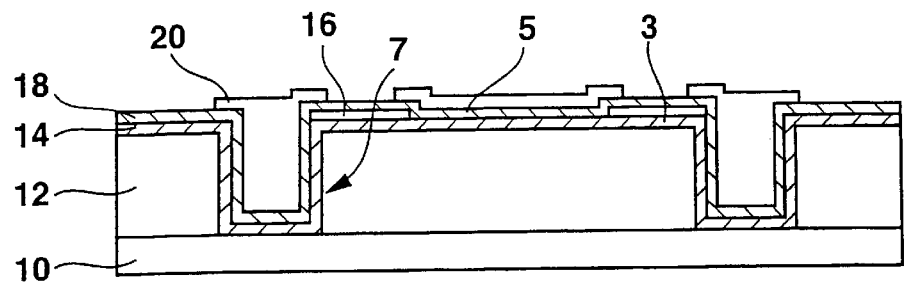
Figure 1H:
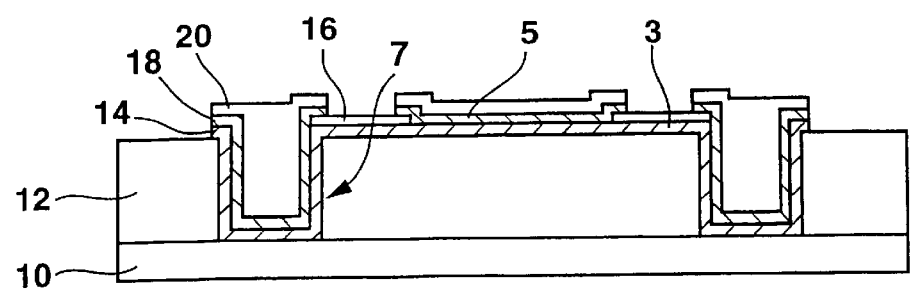
Figure 1I:
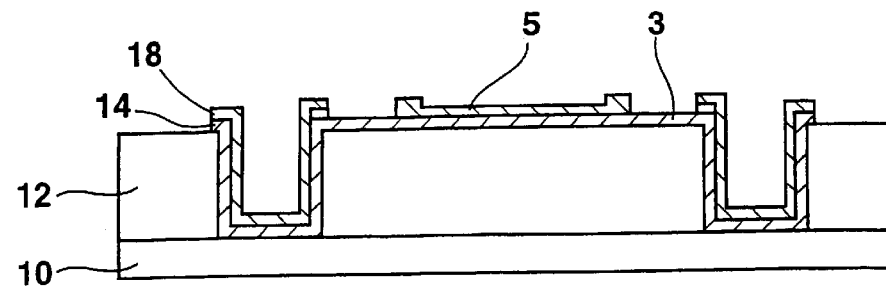
Figure 2A:
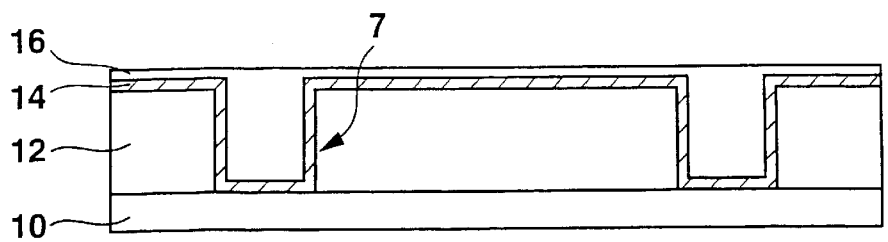
Figure 2B:
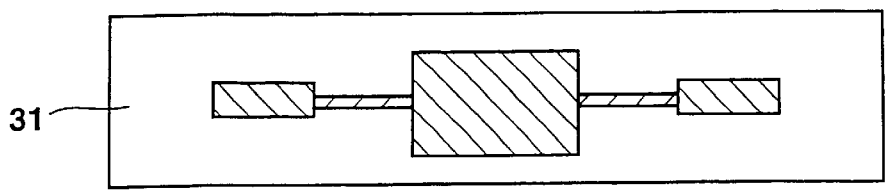
Figure 2C:
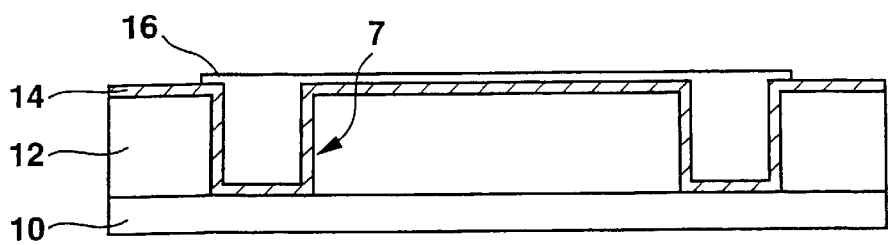
Figure 2D:
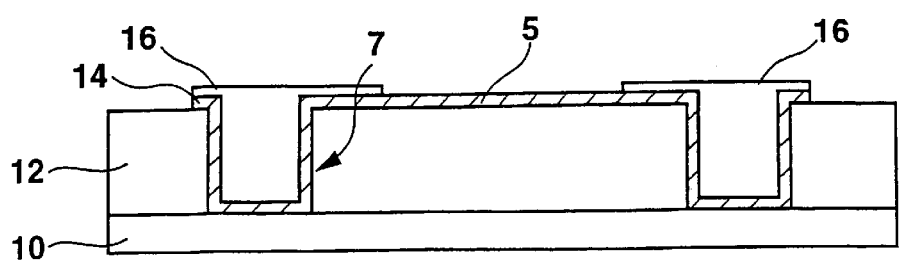
Figure 3A:
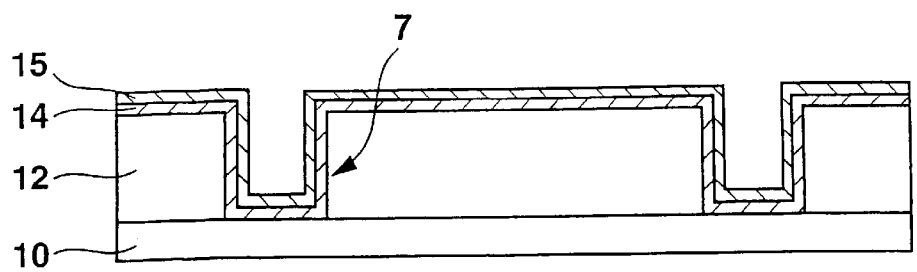
FIGS. 3a–3k illustrate the steps of a method for reinforcing a reflector plate and two posts using a sandwich-type layer sequence, according to the present invention.
Figure 3B:
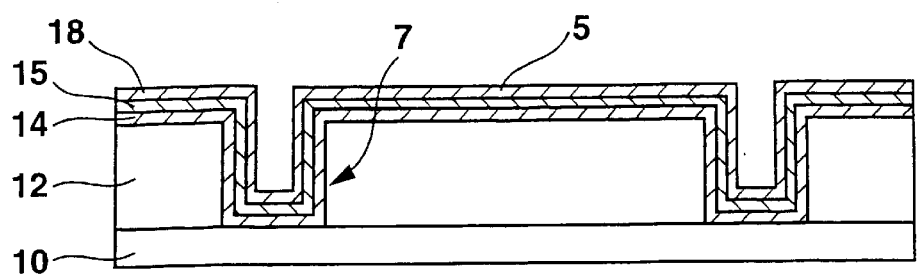
Figure 3C:
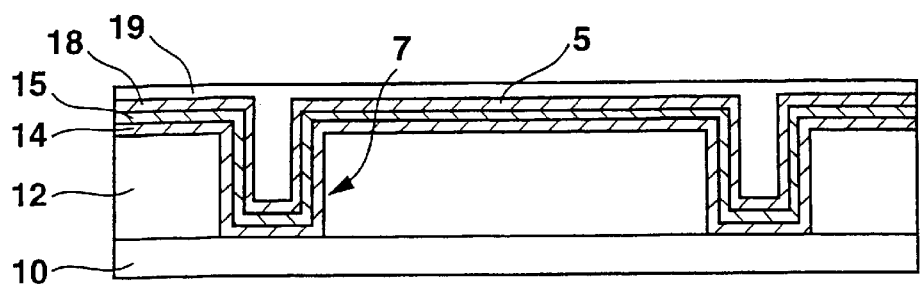
Figure 3D:
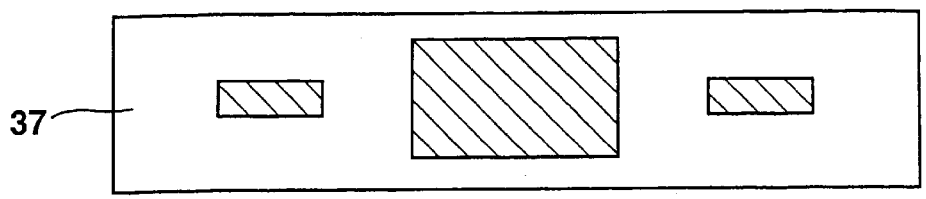
Figure 3D:
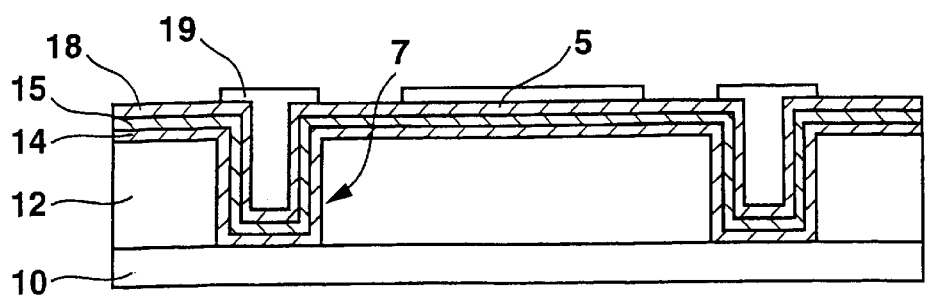
Figure 3E:
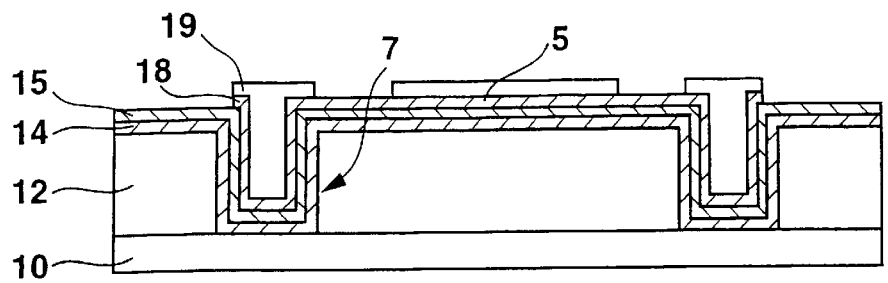
Figure 3F:
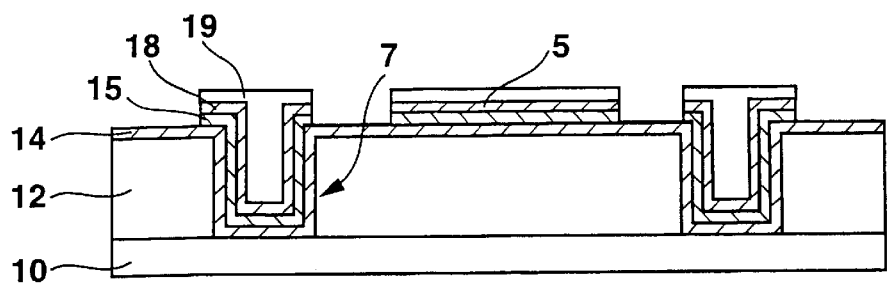
Figure 3G:
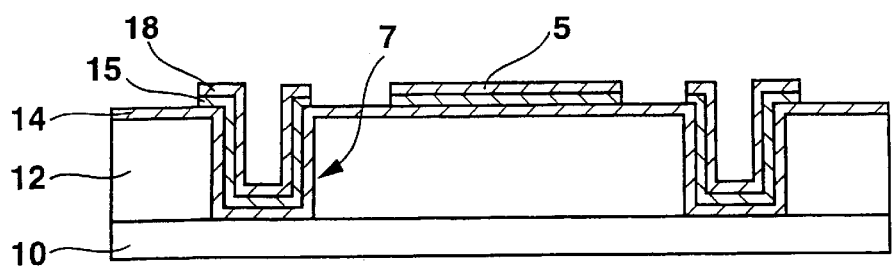
Figure 3H:
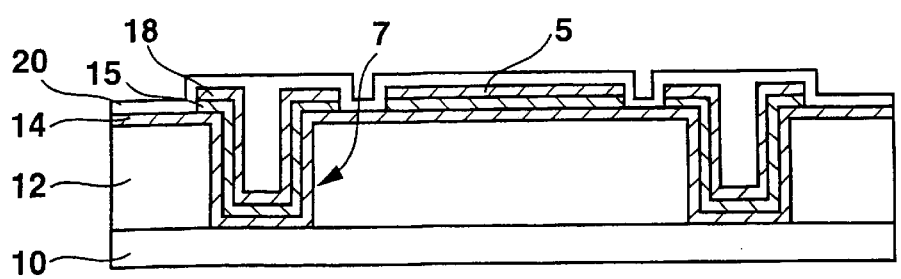
Figure 3I:
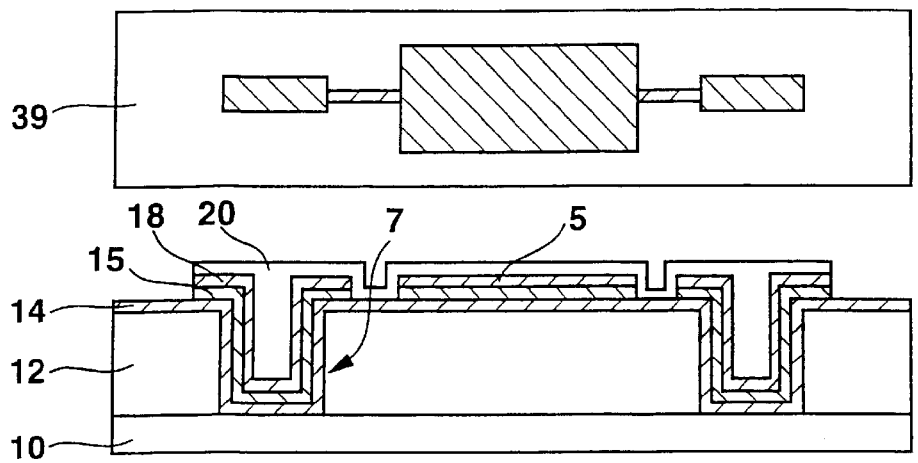
Figure 3J:
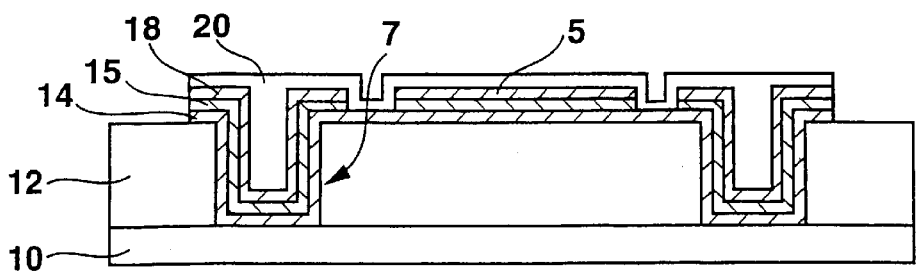
Figure 3K:
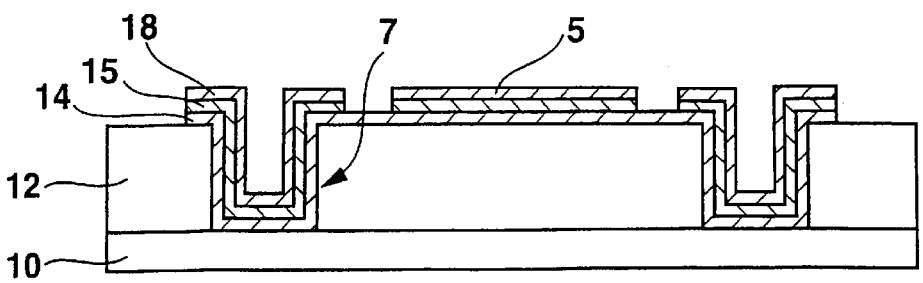
Figure 4A:
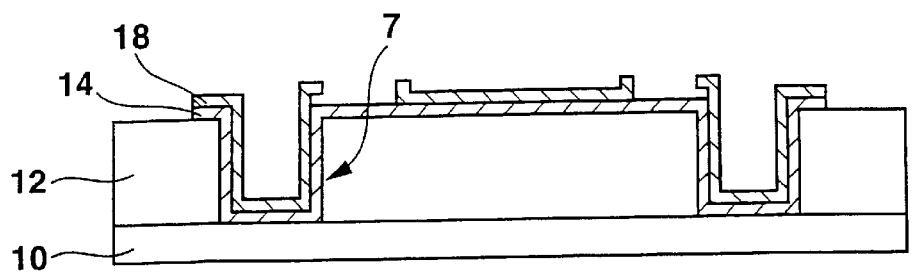
Figure 4B:
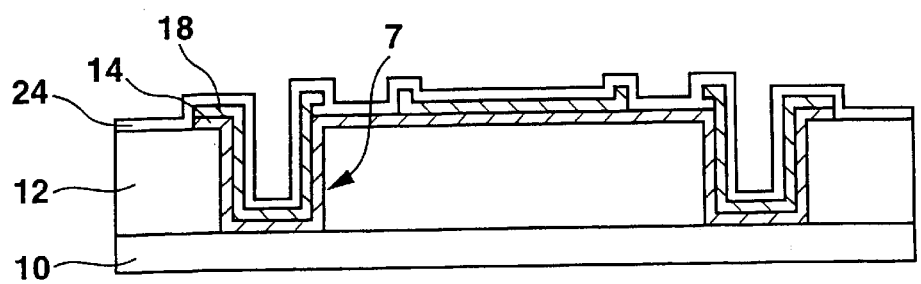
Figure 4C:
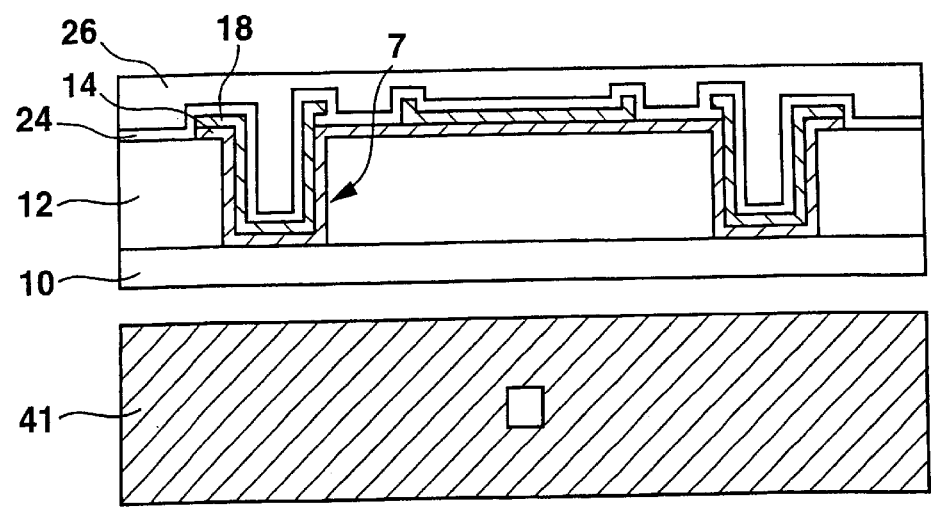
Figure 4H:
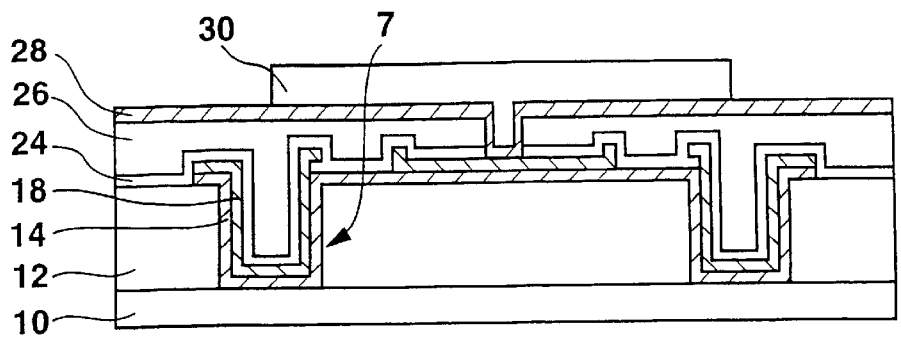
Figure 4I:
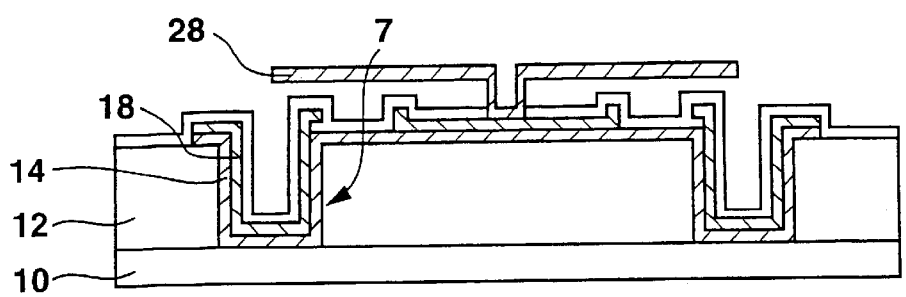
Figure 4J:
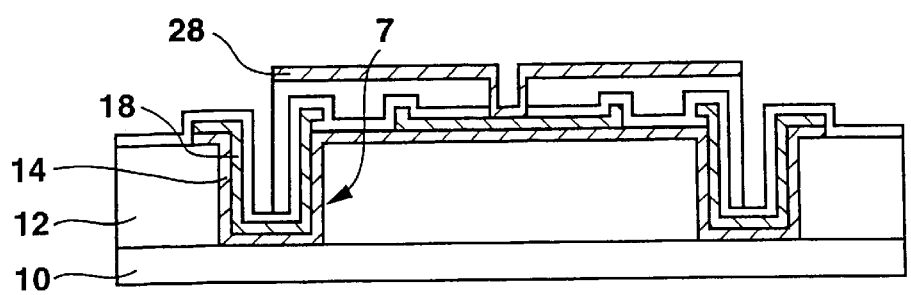
Figure 4K:
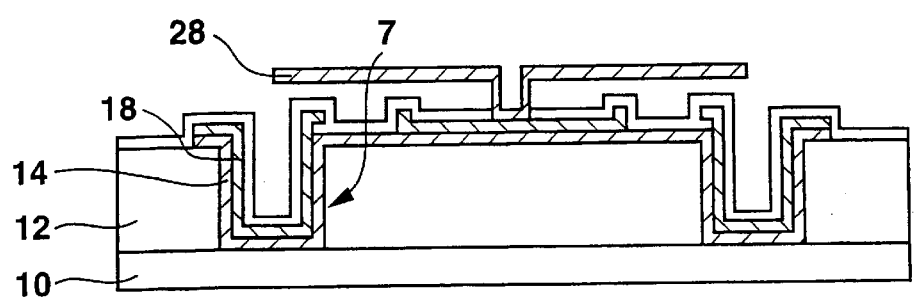
Figure 4L:
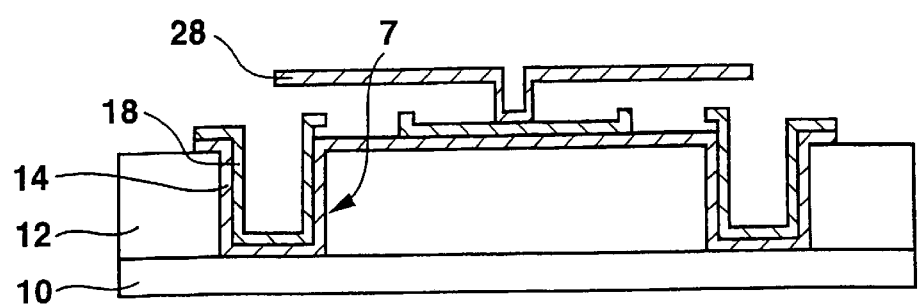
Figure 5A:
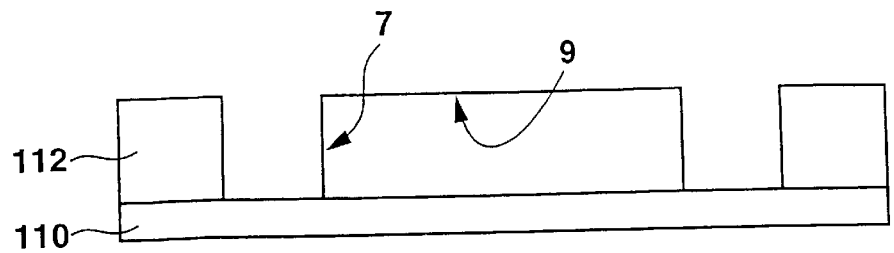
FIGS. 5a–5l depict the steps a method for fabricating a microfeature reinforced by a U-profile, according to the present invention.
Figure 5B:
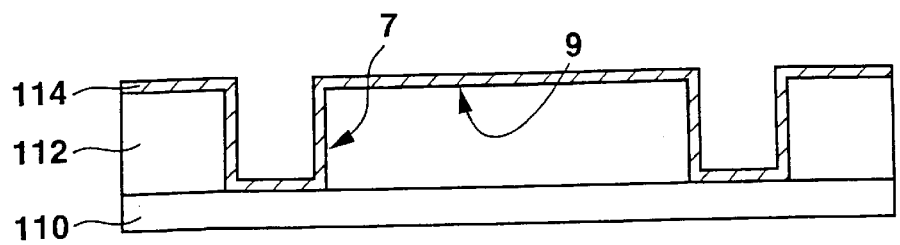
Figure 5C:
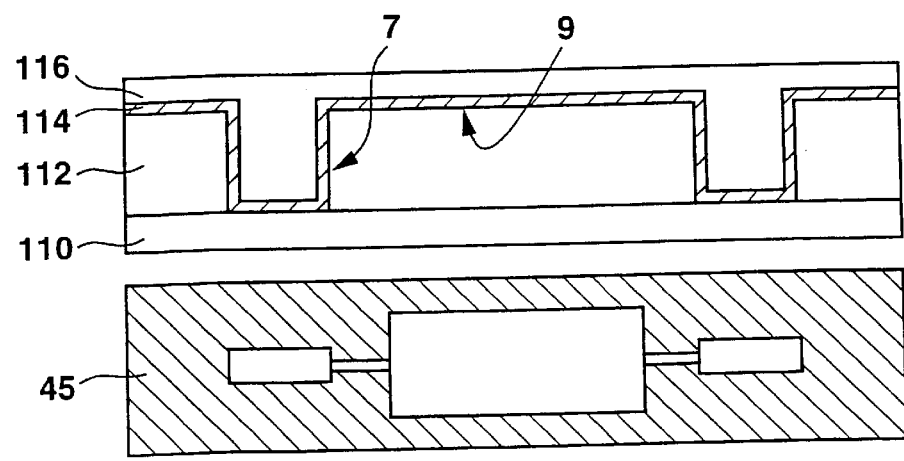
Figure 5D:
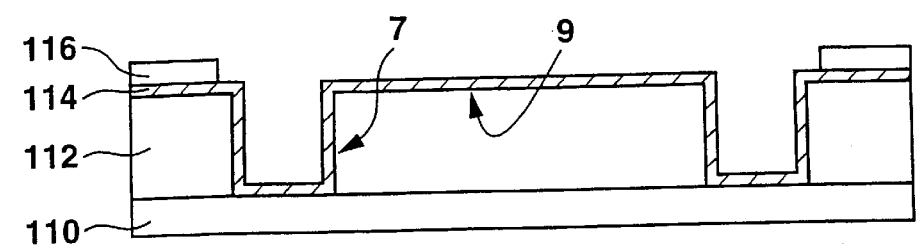
Figure 5E:
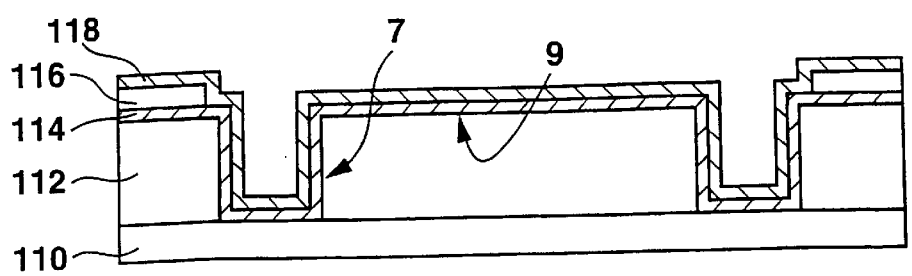
Figure 5F:
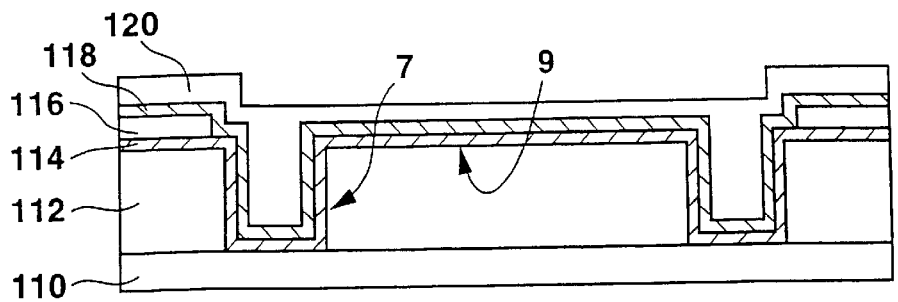
Figure 5G:
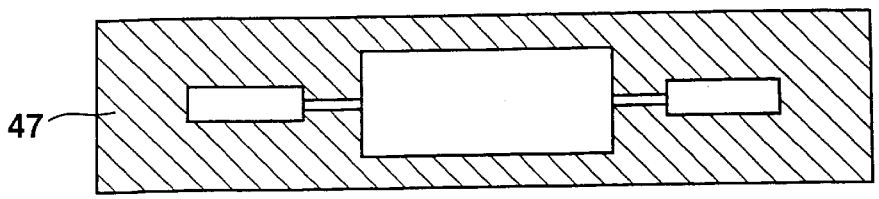
Figure 5G:
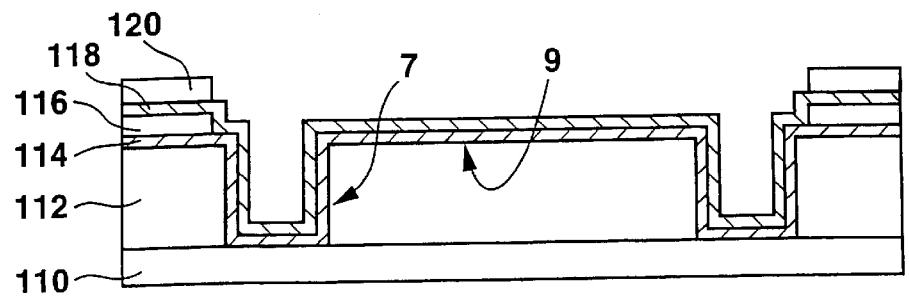
Figure 5H:
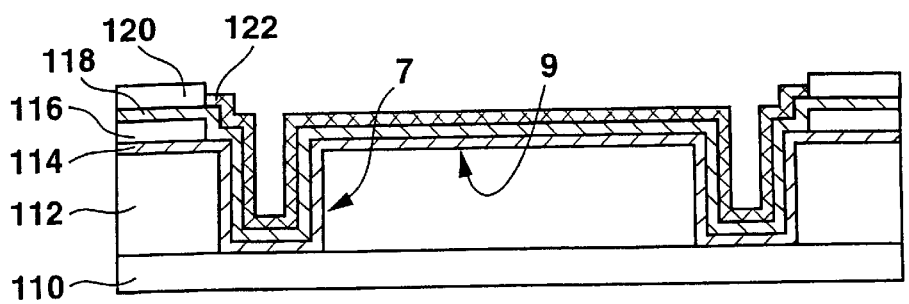
Figure 5I:
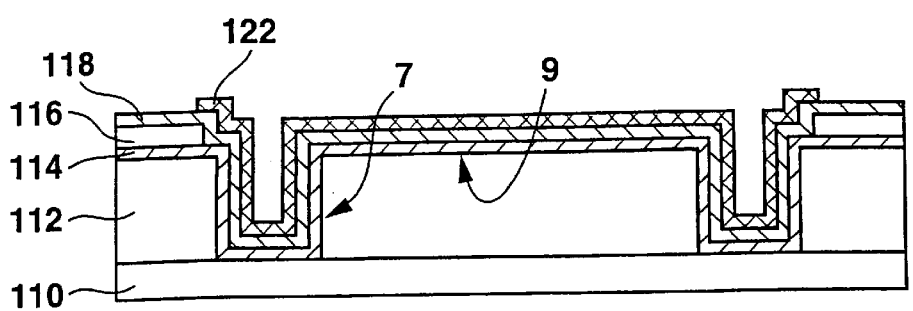
Figure 5J:
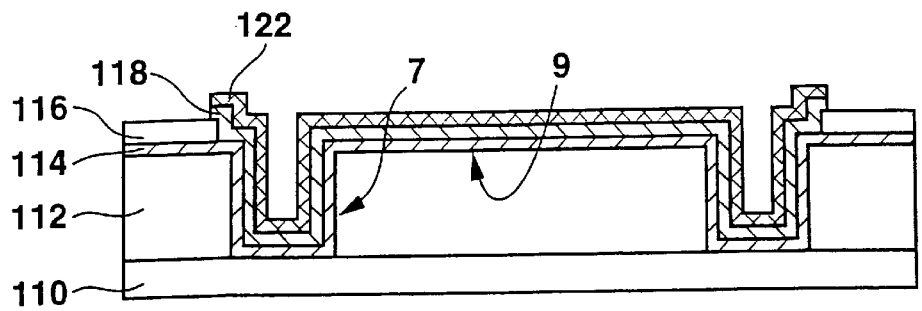
Figure 5K:
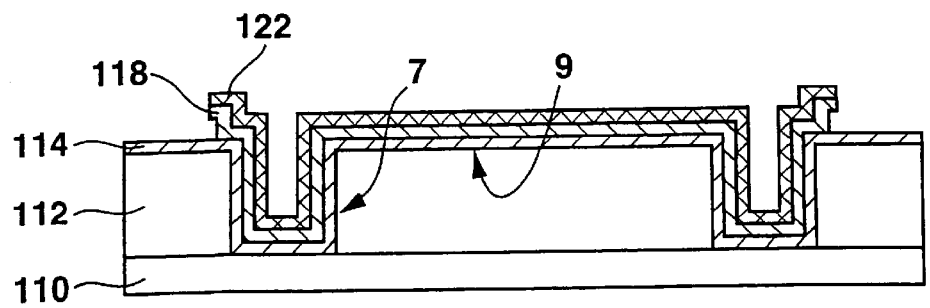
Figure 5L:
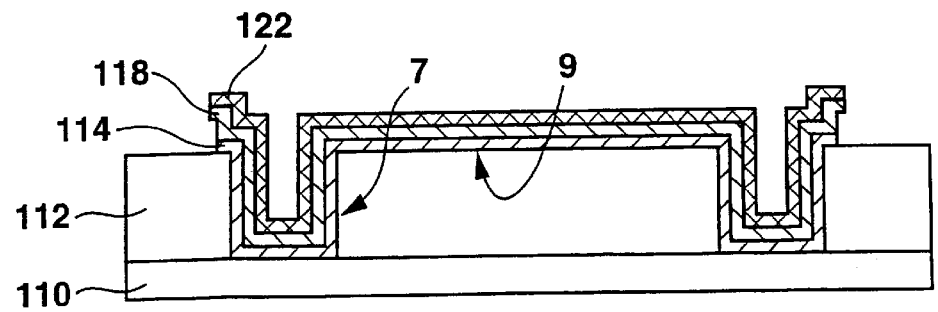

The following basic process steps are used to implement a micro-reflector: cleaning and passivating the substrate (wafer) 10; forming pattern delineations of electrodes or producing a CMOS-driving circuit; pattern delineation of the recesses in a sacrificial layer; sputter-deposition of a metal layer (Al,Ni,Au), if indicated, galvanic electrodeposition (Ni), pattern delineation of a reflector and removal of the sacrificial layer. The method according to the present invention is described beginning with the fabrication of the sacrificial layer 12 (FIG. 1a, method 1). The sacrificial layer of positive photo-sensitive resist, for example AZ 4562 from the firm HOECHST, is deposited in a spin-coating process using a resist centrifuge. For a 10E switching angle, micro-reflectors having, for example, a 50 $\mu$m×50 $\mu$m reflector plate require a theoretical sacrificial-layer thickness of 4.35 $\mu$m. The thickness of the sacrificial layer is selected to achieve the particular desired angle of tilt. The resist is subsequently exposed, e.g., using a Hg-HD lamp, (irradiated) through a UV-transparent mask 17, preferably a mask of quartz or green glass, whose bottom side is patterned out of a chromium—chromium oxide layer, and developed. First metal layer 14 of aluminum is then sputter-deposited onto sacrificial layer 12, i.e., the aluminum layer is deposited by cathode sputtering, e.g. using a magnetron sputtering apparatus, with a pressure of $10^{-3}$–$10^{-2}$ mbar, a power of 350–450 W, and at an argon flow rate of 20–100 sccm.

The thickness (0.1 $\mu$m up to several $\mu$m) of sputter-deposited aluminum layer 14 corresponds to the later thickness of the torsion webs. During the sputtering process, the temperature of the substrate must remain below the maximum curing temperature of the photoresist of sacrificial layer 12, in order to avoid wrinkles and bubbles in the resist layer. To mask the future torsion webs, the photoresist, e.g. AZ 8112 from HOECHST, is spun on with a centrifuge. The thickness of photoresist layer 16 is about 1 $\mu$m. The photoresist is irradiated through a chromium mask 17 and the exposed regions are removed using an aqueous-alkaline developer solution. The temperature during pre-exposure and post-exposure baking of the photoresist is kept below the curing temperature of the sacrificial layer. To nevertheless obtain easily patternable and acid-resistant polymer layers, the temperature step is set to be longer in duration than in the case of a conventional processing. Following a surface activation, e.g., through a short-term ashing in the oxygen plasma, an additional metal layer 18, e.g. an aluminum layer, is sputter-deposited to strengthen reflector plate 5 and recesses 7.

In sputter-depositing additional metal layer 18, the same process conditions apply as when sputter-depositing first metal layer 14. However, additional metal layer 18 is generally thicker (0.2 $\mu$m up to several $\mu$m) and must additionally possess a high reflectivity, e.g. between 88% and 92%. To produce the patterned delineation for aluminum layers 14 and 18, a second photoresist layer 20 of positive photoresist AZ 8112 from HOECHST is deposited on second aluminum layer 18. The photoresist masking process using a mask 21 corresponds to the process already described for masking torsion webs 3.

To avoid damaging the torsion webs or etching right through them when subjecting the metal layers to wet-chemical etching, photoresist layer 16 for torsion webs 3 and the layer for reflector plate 5 and future recesses 7 overlap one another locally. The anchor points of the torsion webs overlap by about 3 $\mu$m. The two aluminum layers 14 and 18 are preferably etched in a wet-chemical process. A dry etching process using IBE is likewise possible. The etching mixture is made up, for example, of phosphoric acid, nitric acid, and acetic acid ($H_3PO_4/CH_3COOH/HNO_3/H_2O$ (4:4:1:1), and of wetting agents. The etching intensity is dependent upon the temperature. One has to pay attention to the fact that this etching mixture attacks photoresist, especially at higher temperatures. For that reason, when working with thick aluminum layers, a thicker photoresist layer must also be selected and, if indicated, cured for a longer period of time. Photoresist layers 16 and 18 are removed using a solvent, such as acetone, or a photoresist developer, or in an ashing process in the oxygen plasma carried out in a tunnel reactor, at 450 W and with an $O_2$ rate of flow of 400–800 sccm.

Still located underneath metal layer 14 (reflector layer) is the organic, patterned sacrificial layer 12. It is not possible to dissolve out sacrificial layer 12 in a wet process, since metal layer 14 would be pulled in the process by adhesive forces toward substrate 10 and would remain stuck there. For that reason, sacrificial layer 12 is removed in a dry process in the fluorocarbon compound-containing plasma of a tunnel reactor, in particular in a tetrafluorocarbon gas-containing plasma at 200 W, with an $O_2$ rate of flow of 50–250 sccm and a $CF_4$ rate of flow of 2–10 sccm.

To reduce the process time, sacrificial layer 12 can be irradiated over the entire surface, and the regions outside of metal layer 14 (reflector plate) can be developed away in a wet chemical process.

Method 2 (FIG. 2) is an alternative to method 1, with the same reaction conditions being retained for the various steps. Following the sputter-deposition of first metal layer 14 of aluminum on the organic, patterned sacrificial layer 12, a photoresist layer 16 of positive photoresist is spun by centrifuge onto the entire surface area, thereby filling in recesses 7. The photoresist is irradiated using a mask 31 and first metal layer 14 is etched to pattern a micro-reflector having a homogenous layer thickness. The already exposed and developed photoresist is now re-exposed in the region of future reflector surface 5, through a mask 33, and removed there in a development process. In the subsequent sputtering step, second metal layer 18 of aluminum is deposited and, following a masking step using a mask 35, is etched. The remaining photoresist is then removed using a solvent, such as acetone or a photoresist developer, or is removed in the oxygen plasma of a tunnel reactor. The organically patterned sacrificial layer 12 is removed in the manner described previously for method 1.

In the third exemplary embodiment (FIG. 3, method 3) a sandwich-type sequence of metal layers 14, 15 and 18 is sputter-deposited onto patterned sacrificial layer 12. A first aluminum layer 14 is sputter-deposited as a base layer onto patterned sacrificial layer 12; then a second metallic layer 15 as an intermediate later of titanium, nickel, or titanium-tungsten (TiW), and finally an additional aluminum layer 18 as an overcoat. On overcoat 18, the regions of recesses 7 and of reflector plate 5 are masked photolithographically using a photoresist layer 19. The process carried out with the use of mask 37 corresponds to the second method for masking the metal layers of method 1 using a positive photoresist, e.g., AZ 8112 from HOECHST. Aluminum overcoat 18 is removed using the phosphoric-acid etching mixture, as discussed above, and intermediate layer 15 of titanium or titanium-tungsten is removed locally in a wet-chemical process using hydrofluoric acid or hydrogen peroxide. Photoresist mask 19 for reflector plate 5 and for recesses 7 is completely removed, first using a solvent, such as acetone, or a photoresist developer, and then in the oxygen plasma of a tunnel reactor. To produce the pattern delineation for the still fully preserved, first aluminum layer 14, the entire surface is provided with a second positive photoresist layer 20, which is patterned using a mask 39.

The metal (aluminum) is etched in a wet-chemical process outside of the masked zones using the etching mixture, and sacrificial layer 12 is removed in a dry process, as described for method 1.

Following removal of photoresist layers 16 or 20 and prior to removal of organically patterned sacrificial layer 12, further construction (build-up) can also be carried out, however, on the metallic structure. One exemplary embodiment is described in method 4 (FIG. 4). A protective layer 24, e.g. of tantalum nitride (TaN) is deposited on the top-most metal layer 18 of the structure and over sacrificial layer 12. A photoresist layer is then deposited as sacrificial layer 26 and patterned using a mask 41, e.g., a recess (cut-out) is formed for a reflector. In the next step, protective layer 24 is etched away in the region of this recess, e.g., the tantalum nitride protective layer using ammonium peroxodisulphate $(NH_4)_2S_2O_8$ or a mixture of hydrofluoric acid, acetic acid, and nitric acid $(HF/CH_3COOH/HNO_3)$ A third metal layer 28 of aluminum is then sputter-deposited onto the photoresist layer (sacrificial layer 26) and pattern-delineated in a wet-chemical etching process to form a reflector plate using a mask 43. The two sacrificial layers 12 and 26 are then removed, as described above.

In this method, one can omit the step of etching protective layer 24. A non-conductive connection (bond) is then obtained between metal layer 18 of the micro-reflector and future reflector surface 28, so that in response to electrostatic driving, the mutual influencing is diminished when working with an array-type configuration. The capacitances and, thus, the recharging currents become smaller.

Locally reinforced microfeatures can also have special geometric shapes, in particular U- and V-profiles, which permit strengthening of the feature, making it possible to thereby reduce the mass of the movable elements and, consequently, achieve a higher natural intrinsic frequency for the micro-reflector. Since the pattern feature is stiffened at the rim regions, the surface area in-between can be relatively thin. In addition, this surface area can be made of two different materials, so that a deflection occurs as a function of the temperature. Underlying the fabrication of these microfeatures is sacrificial layer technology. One exemplary embodiment of a U-profile is shown in FIG. 5. As in the previously described method, a sacrificial layer 112 of photoresist, e.g. AZ 4562 from HOECHST, is deposited, using a resist centrifuge, on a suitable substrate 110, preferably having metal electrodes, a CMOS driving circuit and electronics, and patterned in exposure, using 20 $mW/cm^2$, and development (processes). A sequence of various layers (114,116,118,120) is deposited on the patterned first sacrificial layer 12, to produce the locally reinforced profile.

First metal layer 114, in particular of a rare metal, such as gold or copper, or of titanium or titanium-tungsten, is applied as an adhesion layer and starting layer to first sacrificial layer 112. For the sputter-deposition of a first metal layer (adhesion layer) of gold, a power of between 300 W and 500 W, a process chamber pressure in the range of 0.01 mBar, and a process temperature of below 100EC may be used. Metal layer 114 is also used as a protective layer for a second sacrificial layer 116, which is spun by centrifuge from photoresist , e.g., AZ 4533 from HOERST, onto first metal layer 114. Second Sacrificial layer 116, whose height (level) is that of the U-profile edges to be fabricated, is patterned using a mask 45; and a second metal layer 118, in particular of a rare metal, such as gold or copper, or of titanium or titanium-tungsten is deposited thereon. In this context, perpendicular reinforcement edges are formed at the rims, as are torsion webs of the U-profile. This feature is also referred to as a well shape.

A third, spun-on sacrificial layer 120 is patterned using a mask 47 to form the edges of the U-profile. Mask 47 resembles mask 45, but the openings of mask 47 are larger by the width of the profile; thus, the metallization (metallic coating) at the substrate rim is not covered, facilitating rebounding of the layer that follows. Metal layer 122 of the microfeature is produced galvanically, for example, using nickel or nickel cobalt. A typical Ni-bath for galvanic metal deposition is composed of nickel sulphate ($NiSO_4$), nickel chloride (NiCl), and boric acid ($H_3BO_3$) having a pH-value of 5.3, and with a bath temperature of 50EC. Once the microfeature is fabricated, third sacrificial layer 120 is removed using a solvent, such as acetone; second metal layer 118 using a suitable etching solution; second sacrificial layer 116, in turn, using a solvent, such as acetone, and first metal layer 114, again using a suitable etching solution.

Sacrificial layers 116, 120 are removed, preferably in a wet-chemical process, as long as the features are not undercut, which would result in their being deformed and pulled toward the substrate.

First sacrificial layer 112 is removed in an ashing process in a plasma of oxygen- and fluorine-containing carbon compounds, such as $CF_4$, of a tunnel reactor. The process parameters used are preferably between 100 and 150 W for the RF-power, at 100–200 sccm for the $O_2$ rate of flow, and between 2 and 10 sccm for the $CF_4$ rate of flow, depending on the layer thickness and the reflector dimensions.

Sputter-deposition technology can be applied in a similar method to obtain V-shaped features. To effect this, appropriate parameters for the posts (recesses) are selected to form very flat edge slopes in the sacrificial layer, upon which sufficient metal (aluminum) can be sputter-deposited.

With this method, torsion webs may be produced having an elevated restoring moment, given a small mass, as well as large-surface, self-supporting (floating) features having enhanced strength/rigidity. Using the principle introduced here, one is also able to produce a membrane having a stable frame out of two different materials. The bimetal effect arises in response to a temperature change. Thus, one can produce electrostatically driven micro-reflectors, whose focal distance is able to be thermally controlled. Concave and convex surfaces can be selectively adjusted by varying the temperature, thereby inducing focusing and defocusing properties in the micro-reflectors.

What is claimed is:

1. A method for fabricating a locally reinforced metallic microfeature on a substrate, comprising:
    providing an organic, patterned first sacrificial layer on the substrate;
    providing at least one further organic layer formed as a mask;
    providing a metal layer;
    patterning the metal layer by a wet-chemical etching method to form the microfeature;
    after patterning the metal layer, removing the at least one further organic layer;
and after removing the at least one further organic layer, removing the first sacrificial layer in a dry manner in a plasma containing fluorocarbon compounds.

2. The method according to claim 1, wherein the microfeature is an aluminum feature.

3. The method according to claim 1, further comprising:
    providing at least one of an electrical contacting circuit and a driving circuit on the substrate.

4. The method according to claim 1, wherein the at least one further organic layer is a photoresist which is applied as a mask to form the microfeature.

5. The method according to claim 4, wherein the photoresist is a positive photoresist.

6. The method according to claim 1, wherein the step of providing the first sacrificial layer on the substrate includes spinning on the first sacrificial layer, and wherein the step of providing the at least one further organic layer includes spinning on the at least one further sacrificial layer.

7. A method for fabricating a locally reinforced metallic microfeature on a substrate, comprising:
    providing an organic, patterned first sacrificial layer on the substrate;
    sputter-depositing a first metal layer on the first sacrificial layer;
    masking regions of the first metal layer using a first photoresist layer, the regions of the first metal layer being regions to be preserved;
    after the masking step, sputter-depositing a second metal layer on an entire surface of the masked first metal layer;
    masking regions of the second metal layer using a second photoresist layer, the regions of the second metal layer being regions to be preserved;
    etching unmasked regions of the first metal layer and the second metal layer; and
    after the etching step, removing the first photoresist layer and the second photoresist layer;
    wherein the above-identified steps are performed in the order indicated.

8. A method for fabricating a locally reinforced metallic microfeature on a substrate, comprising:
    providing an organic, patterned first sacrificial layer on the substrate;
    sputter-depositing a first metal layer on the first sacrificial layer;
    masking regions of the first metal layer to be preserved using a first photoresist overlay;
    etching unmasked regions of the first metal layer;
    removing the first photoresist layer only in regions to be reinforced;
    after removing the first photoresist layer, sputter-depositing a second metal layer;
    masking regions of the second metal layer to be preserved with a second photoresist layer;
    etching unmasked regions of the first metal layer and the second metal layer; and
    removing the first photoresist layer and the second photoresist layer;
    wherein the above-identified steps are performed in the order indicated.

9. A method for fabricating a locally reinforced metallic microfeature on a substrate, comprising:
    providing an organic, patterned first sacrificial layer on the substrate;
    sputter-depositing a first metal layer on the first sacrificial layer;
    sputter depositing a second metal layer on the first metal layer, the second metal layer including a different metal than the first metal layer, the second metal including one of Ti, Ni and TiW;
    sputter-depositing a further metal layer on the second metal layer, the further metal layer including aluminum;

masking first regions of the first metal layer, the second metal layer and the further metal layer to be preserved with a first photoresist layer;

after the step of masking the first regions, etching unmasked regions of the additional metal layer;

after etching the unmasked regions of the additional metal layer, etching unmasked regions of the second metal layer;

removing the first photoresist layer;

masking second regions of the first metal layer, second metal layer and further metal layer to be preserved with a second photoresist layer;

after the step of masking the second regions, etching unmasked regions of the first metal layer; and removing the second photoresist layer;

wherein the above-identified steps are performed in the order indicated.

10. The method according to claim 1, further comprising:

depositing a protective layer of tantalum nitride on the microfeature;

depositing a photoresist sacrificial layer on the protective layer;

patterning the photoresist sacrificial layer via exposure and development;

etching to partially remove the protective layer;

sputter-depositing a further metal layer, the further metal layer being an aluminum layer;

after the step of sputter-depositing, depositing a further photoresist layer and forming the further photoresist layer as a mask; and wet-chemical etching the further metal layer.

11. The method according to claim 7, wherein the step of removing the first photoresist layer and the second photoresist layer include one of: i) removing the first photoresist layer and the second photoresist layer using acetone, ii) removing the first photoresist layer and the second photoresist layer using a sulphuric acid—hydrogen peroxide mixture, iii) ashing the first photoresist layer and the second photoresist layer in an oxygen plasma of a tunnel reactor, and iv) ashing the first photoresist layer and the second photoresist layer in an oxygen plasma having tetrafluorocarbon of the tunnel reactor.

12. A method for fabricating a locally reinforced metallic microfeature on a substrate, comprising:

providing an organic, patterned first sacrificial layer on the substrate;

applying a first metal layer to the first sacrificial layer as a protective layer, the first metal layer being a first layer of gold;

depositing a second sacrificial layer on the first metal layer;

patterning the second sacrificial layer at rim regions;

applying a second metal layer to the second sacrificial layer as a protective layer, the second sacrificial layer being a second layer of gold;

depositing a third sacrificial layer on the second metal layer;

patterning the third sacrificial layer;

galvanically applying a third metal layer, the third metal layer including one of Ni and Co/Ni; and after applying the third metal layer, removing the first sacrificial layer, the second sacrificial layer, and the third sacrificial layer;

wherein the above-identified steps are performed in the order indicated.

13. The method according to claim 12, wherein the microfeature is an aluminum feature.

14. The method according to claim 12, further comprising:

providing one of an electrical contacting circuit and a driving circuit on the substrate.

15. The method according to claim 7, wherein the metal layers are etched by a wet-chemical etching method.

16. The method according to claim 7, wherein the sacrificial layers are removed in a dry manner in a plasma containing fluorocarbon compounds.

* * * * *